(12) United States Patent
White

(10) Patent No.: US 6,396,881 B1
(45) Date of Patent: May 28, 2002

(54) MINIMUM-DELAY FREQUENCY-SHIFT-COMPENSATING COMPLEX DEMODULATOR WITH ARBITRARY PHASE ADJUSTMENT

(76) Inventor: Stanley A. White, 433 E. Avenida Cordoba, San Clemente, CA (US) 92672

( * ) Notice: Subject to any disclaimer, the term of this patent is extended or adjusted under 35 U.S.C. 154(b) by 0 days.

(21) Appl. No.: 09/253,205

(22) Filed: Feb. 19, 1999

(51) Int. Cl.[7] ................................................ H03D 3/22
(52) U.S. Cl. .................................. 375/329; 375/321
(58) Field of Search ................................ 375/316, 321, 375/324, 329, 323, 331, 340, 371, 350, 261, 279, 280, 270; 348/541, 528, 725, 720, 721; 329/304; 455/203, 204, 304

(56) References Cited

U.S. PATENT DOCUMENTS

| | | |
|---|---|---|
| 4,955,039 A | 9/1990 | Rother et al. |
| 5,406,587 A | 4/1995 | Horwitz et al. |
| 5,457,424 A | 10/1995 | McGinn et al. |
| 5,491,725 A | 2/1996 | White |
| 5,550,866 A | 8/1996 | White |
| 5,598,125 A | 1/1997 | Makinen |
| 5,602,601 A | 2/1997 | Kim et al. |
| 5,764,705 A | 6/1998 | White |
| 5,841,814 A * | 11/1998 | Cupo .......................... 375/321 |
| 5,872,815 A * | 2/1999 | Strolle et al. ................ 375/321 |
| 6,205,225 B1 * | 3/2001 | Orban ......................... 381/94.8 |
| 6,252,916 B1 * | 6/2001 | Wiegand ..................... 375/302 |
| 6,295,325 B1 * | 9/2001 | Farrow et al. ............... 375/327 |
| 6,333,767 B1 * | 12/2001 | Patel et al. .................. 348/725 |

* cited by examiner

Primary Examiner—Chi Pham
Assistant Examiner—Emmanuel Bayard
(74) Attorney, Agent, or Firm—Stout, Uxa, Buyan & Mullins, LLP; Donald E. Stout

(57) ABSTRACT

A solid-state gyroscope in a closed flight-control loop produces a DSSC QAM body angular-rate output signal and a drive current, which is converted to a demodulation reference signal. The frequency of the demodulation reference signal drifts slowly. A digital complex AM demodulator must demodulate the rate-output signal and correct the phase shift with as little delay as possible. This demodulator employs three elemental Hilbert transformers (EHT), one for direct current (d.c.) blocking and two for phase shifting. The gains of these Hilbert transformers shift with the drive frequency. In order to hold signal-path delays to a minimum, the gains of the Hilbert transformers are held to unity by means of a simple Least Mean Squared (LMS) adaptive loop whose output feeds the gain multiplier of all three Hilbert transformers. Automatic phase-shift correction is also included by adaptively rotating the demodulator reference phase in order to decorrelate the outputs of the demodulator.

43 Claims, 7 Drawing Sheets

MINIMUM-DELAY FREQUENCY-SHIFT-COMPENSATING COMPLEX DEMODULATOR WITH ARBITRARY PHASE ADJUSTMENT

BACKGROUND OF THE INVENTION

1. Field of the Invention

The present invention relates generally to digital signal processing and, more particularly, to the demodulation of a body angular-rate signal for use in a navigation and flight-control system.

2. Description of Related Art

Information often modulates an underlying carrier signal, thereby producing a modulated information signal. This same carrier signal is required, with a few modifications, to demodulate the modulated information signal. This required signal is called the demodulation-reference signal. It must be complex, that is, it must contain separate in-phase and quadrature outputs. A degraded version of this signal is often available with the correct frequency, but with the wrong phase and amplitude, and with a zero frequency or direct-current offset.

The source of the modulated information signal may be, for example, a quartz angular rate sensor. The degraded demodulation-reference signal may come from the apparatus driving the source of the modulated information signal, or it may come from the source of the modulated information signal itself.

A sensor incorporating a resonator can be driven with a known periodic drive signal. The drive signal preferably has a frequency at or close to the natural frequency of the resonator, and preferably has a shape which is a sinusoid with constant amplitude. Other frequencies and shapes can be used depending on the application, but such alternative applications will be very rare. The resonator responds to the drive signal by producing a data output signal which is a quadrature amplitude modulated (QAM) double-sideband suppressed-carrier (DSBSC) modulation of the drive signal. The output signal depends on the drive signal, and further depends on the parameters of the resonator, but these are known. Over short periods of time, they may productively be considered to be fixed.

One type of sensor system comprises an inertial-measuring unit (IMU) known as the Digital Quartz IMU (DQI). The sensed information of the DQI is the angular rate of rotation, but other resonators could just as easily be designed to respond to information about any of a number of other sensed parameters: temperature, viscosity, or anything else. The sensed information which is desired to be extracted has amplitude-modulated the drive signal $\cos(\omega_d t)$; that should be the sensor output signal, $y(t)=x(t)\cos(\omega_d t)$, where $x(t)$ is the sensor input signal (a direct indication of angular rate, viscosity, etc.) and $\omega_d$ is the drive frequency. In order to extract the sensed information one could therefore (ideally) demodulate the sensor output signal using the drive signal as the reference.

There are some flaws with this reasoning. The sensor output signal is actually expressed as:

$$y(t)=[x(t)+A]\cos(\omega_d t+\phi)+B\sin(\omega_d t+\phi) \qquad \text{Equation 1}$$

The variables A, B and f can drift with temperature and aging. The demodulation of the resonator data output signal is complex. That is, the resonator data output signal is separately multiplied by two periodic signals (generally sinusoids) which are known to be in quadrature. The first is referred to as the in-phase reference signal, and the second is referred to as the quadrature-phase reference signal. This multiplication thereby produces an in-phase product signal and a quadrature-phase product signal.

A set of three solid-state gyroscopes known as quartz rate sensors (QRS), plus a set of three solid-state accelerometers, plus all of their associated support and signal-processing electronics are packaged into a compact rugged mechanical assembly with the necessary vibration isolators and environmental controls to comprise the DQI. The DQI provides 3-axis body angular-rate information and 3-axis acceleration information for a full 6-degree-of-freedom (6-DOF) output. The 6-DOF output is available at a 600 sample/second/sensor data rate over a standard AMRAAM interface. The 6-DOF data outputs are used as inputs directly to autopilot/flight-stabilization controllers, and as inputs (alone or augmented by sensors such as GPS receivers) to a navigation computer.

The outputs of each QRS instrument are subject to undesirable phase shifts, which can vary with time and between the various QRS instruments. For proper operation, the demodulation reference signal must be phase shifted back an equal and opposite amount within the demodulator. One prior-art demodulator requires the use of two QRS-instrument-specific calibration numbers. The demodulator has several (usually three) stages where the gain of each stage is a function of the demodulation-reference frequency (which reference frequency is different for each instrument). The demodulator performs a gain correction using the downloaded calibration inputs. Similarly, the demodulator corrects the instrument-physics-caused phase-shift error in the demodulation-reference signal (which phase-shift error is again different for each instrument) using downloaded calibration inputs. These corrections are necessary for the proper and accurate operation of the DQI. Unfortunately, there are three possible problems that arise from using these calibration and correction procedures. First, the calibration inputs may be in error because QRS instrument parameters change with time and environmental influences; second, there may be factory errors in measurement and/or recording the calibration data; third, there may be human error in physically connecting the instrument to the correct memory which contains the calibration data.

The phase-shift-error problem can be substantially eliminated by combining with the demodulator an automatic phase-shift corrector; specifically, Applicant's invention disclosed in U.S. Pat. No. 5,764,705, "Adaptive Phase-Shift Adjuster for Resonator." This automatic phase-shift corrector, however, requires that the frequency-sensitive gains be corrected, just as with the rest of the demodulator. Such sensitivities may be substantially eliminated at the cost of additional computation, but more importantly, at the cost of greater delays in the demodulator. Because the I-channel output is in the feedback flight-control loop, any unnecessary delay is intolerable.

One particular recurrent problem relates to automatic amplitude normalization of a sinusoidal signal of fixed amplitude at the output of a digital elemental Hilbert transformer (EHT) as the nominal 10 kHz demodulation-reference frequency wanders with time and/or environmental influences such as temperature. Conventional wisdom and Hilbert-transformer design would lead one to widen the bandwidth of the Hilbert transformer, such as is done routinely in the design of applications such as communications systems. The problem is that as the bandwidth of the Hilbert transformer is increased, the delay times increase. Although this may be no problem for a communications application, it is fatally intolerable for a feedback-control system.

SUMMARY OF THE INVENTION

The invention which is the subject of this application provides a means to eliminate the frequency-sensitive gains in the demodulator without increasing the delays. A minimum-delay structure is maintained with the inventive capability of automatically correcting its gain in response to changes in the signal frequency.

A Hilbert transformer input is a sinusoidal signal, $x_n$, whose frequency lies within a specified range. The input frequency is assumed to be fixed and under sinusoidal steady-state conditions, or very slowly time varying. The amplitude of the sinusoidal signal, $y_n = K_n(x_n - x_{n-2})$ at the output of the Hilbert transformer is dynamically set to match the amplitude of the input by adjusting the value of $K_n$ as described in the paragraph below. For fixed gain $K_n = K$, the z transform of the relationship between $x_n$ and $y_n$ is $$Y(z)/X(z) = K(1-z^{-2}) = z^{-1}[2K(z-z^{-1})/(2j)] \quad \text{Equation 2}$$

The term $z^{-1}$ denotes a single sample period of pure delay. The heart of the Hilbert-transform operation is $j = \text{SQRT}(-1)$. In order for this operator to have a unit gain in response to a sinusoidal steady-state signal of frequency $\omega_d$ the present invention sets $z = \exp(j\omega_d T)$ and finds that the gain must be $K = 1/[2 \sin(\omega_d T)]$. Since K must be free to chase after its optimum value in accordance with the present invention, the fixed K is replaced by a time varying $K_n$, the value of the gain at sample time n. In order to generate a simple-to-mechanize, functionally robust error signal, $e_n$, a second Hilbert transformer is employed in tandem with the first. For convenience an equation $u_n = y_n - y_{n-2}$ is defined, so that the output of the second Hilbert transformer is $w_n = u_n K_n$, which, for proper $K_n$, is $w_n = -x_{n-2}$. The simple gain-sensitive error is defined to be $e_n = x_{n-2} + w_n$.

The value of $K_n$ is adaptively computed using the well known least mean squared (LMS) criterion. The unbiased instantaneous estimate of the mean-squared error is $e_n^2$. The steep-descent parameter-adjustment algorithm calls for setting the rate of adjustment of $K_n$ proportional to the negative of the gradient of $e_n^2$, or to $-\mu e_n g_n$, where the error gradient is $g_n = y_n + u_n$, and $\mu$ is a constant that governs the convergence rate. The $\mu e_n g_n$ product is integrated (or accumulated), and finally scaled and biased (to match the specified frequency range) in order to maximize the usable dynamic range of the accumulator. That scaled and biased output is $K_n$. This demodulator has three Hilbert transformer units in the direct signal-processing path, plus a fourth one used in the generation of $K_n$, all of which are driven directly by $K_n$.

Although the present invention is particularly well suited to the above-mentioned quartz angular rate sensor, it is well suited to any application in which there is an amplitude-modulated information signal, and in which there is a degraded demodulation-reference signal which must be upgraded enough to demodulate the amplitude-modulated information signal.

The present invention, together with additional features and advantages thereof, may best be understood by reference to the following description taken in connection with the accompanying illustrative drawings.

DETAILED DESCRIPTION OF THE PRESENTLY PREFERRED EMBODIMENTS

Figure 1:
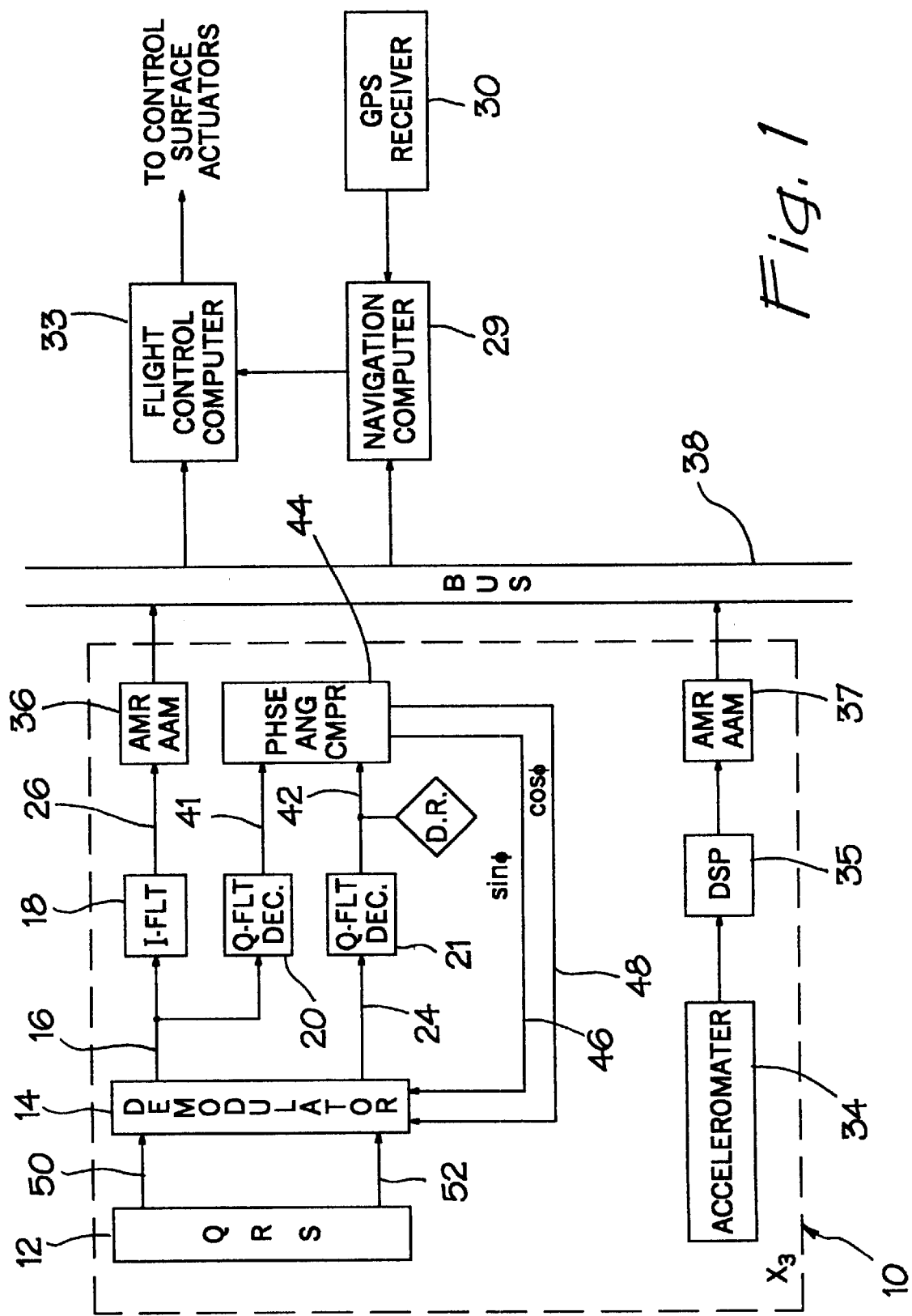
FIG. 1 is a block diagram providing a system overview.

Referring now more particularly to the drawings, FIG. 1 illustrates a Digital Quartz Inertial-measuring unit (DQI) 10 comprising quartz rate sensors (QRS) instrument 12 and a demodulator 14. The two outputs of the QRS instrument 12 are connected to the demodulator 14. The demodulator I-channel output 16 is connected to the I-channel filter 18 and to a Q-channel filter and decimator 20. The demodulator Q-channel output 24 is connected to Q-channel filter and decimator 21.

Figure 5:
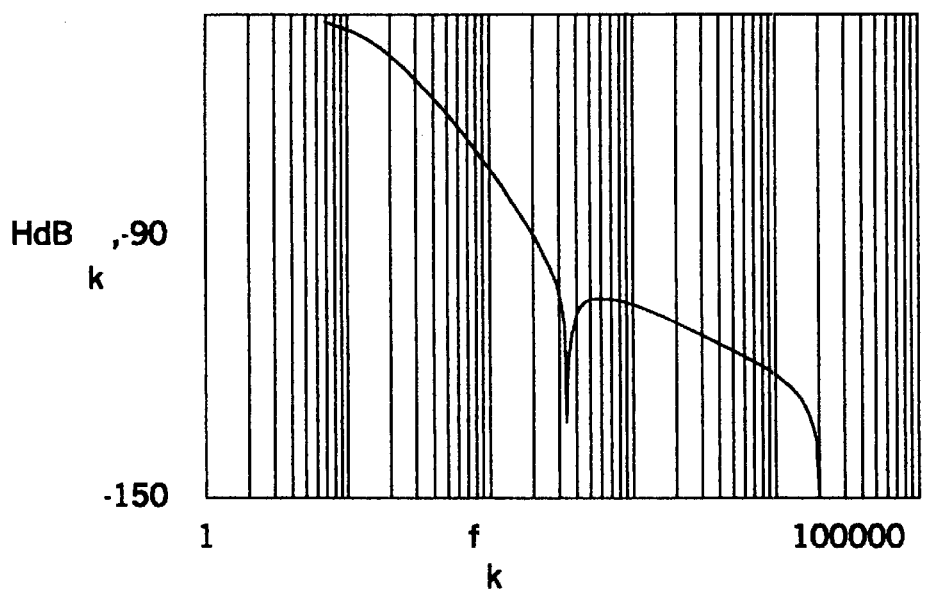
FIG. 5 is a plot depicting the amplitude-frequency response of the Q-filter of the presently preferred embodiment.
Figure 6:
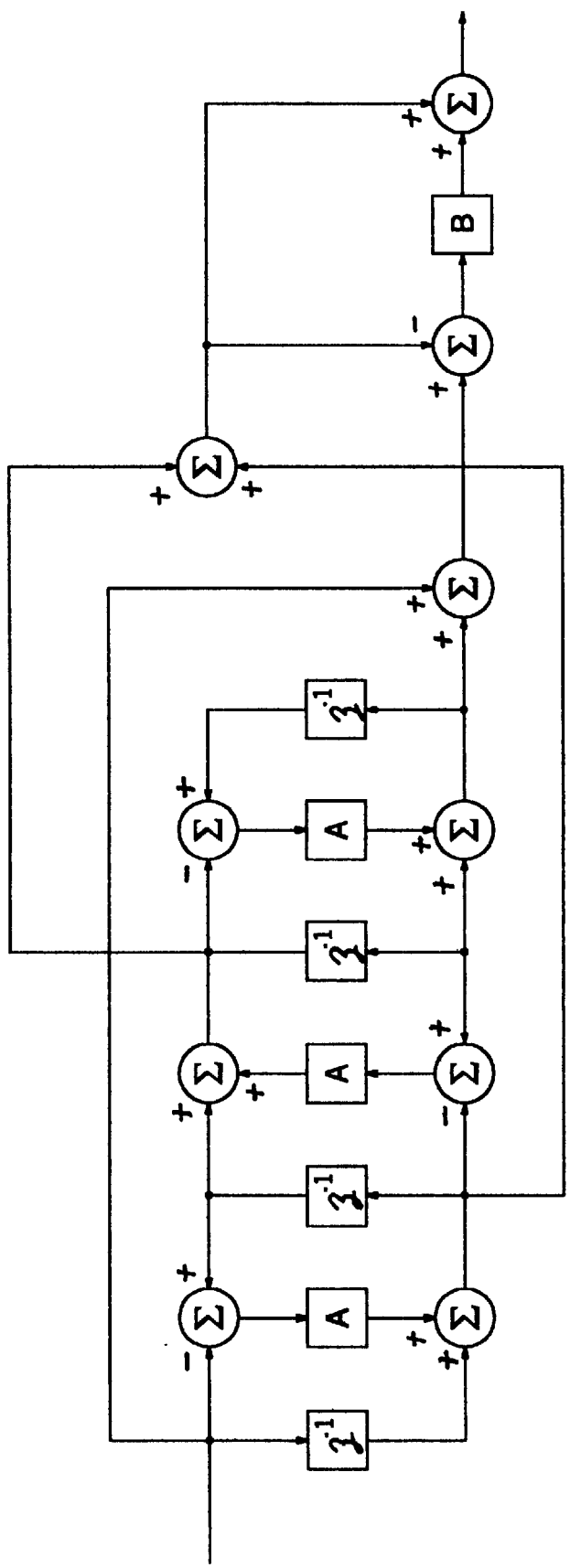
FIG. 6 is a digital circuit diagram depicting the Q-filter of the presently preferred embodiment.

The I-channel filter output 26 communicates with the navigation computer 29 and the flight control computer 33 through the AMRAAM interface 36 and data bus 38. A Global Positioning Satellite (GPS) receiver 30 is coupled to the navigation computer 29. The navigation computer is coupled to the flight-control computer. The flight-control computer 33 outputs drive the vehicle actuator surfaces (e.g., rudder, elevator, ailerons). The two decimated Q-channel filter outputs 41, 42 are connected to the phase angle computer 44 whose outputs $\sin(\phi)$ 46 and $\cos(\phi)$ 48 are fed back to the demodulator 14. Data from a solid-state accelerometer 34 is processed by the DSP 35 and, subsequently, forwarded to the AMRAAM interface 37. Two more rate channels (not shown) and two additional accelerometer channels (not shown) are connected to the data bus 38 through the AMRAAM interface 36, 37. The presently preferred embodiment of the Q-channel filter 20,21 is discussed in detail in the section below entitled "THE Q-CHANNEL FILTER." An amplitude-frequency response plot and a digital circuit diagram supplementing the description of this section are provided in FIGS. 5 and 6, respectively. Other Q-channel filters may be used in accordance with modified embodiments of the present invention.

Figure 2:
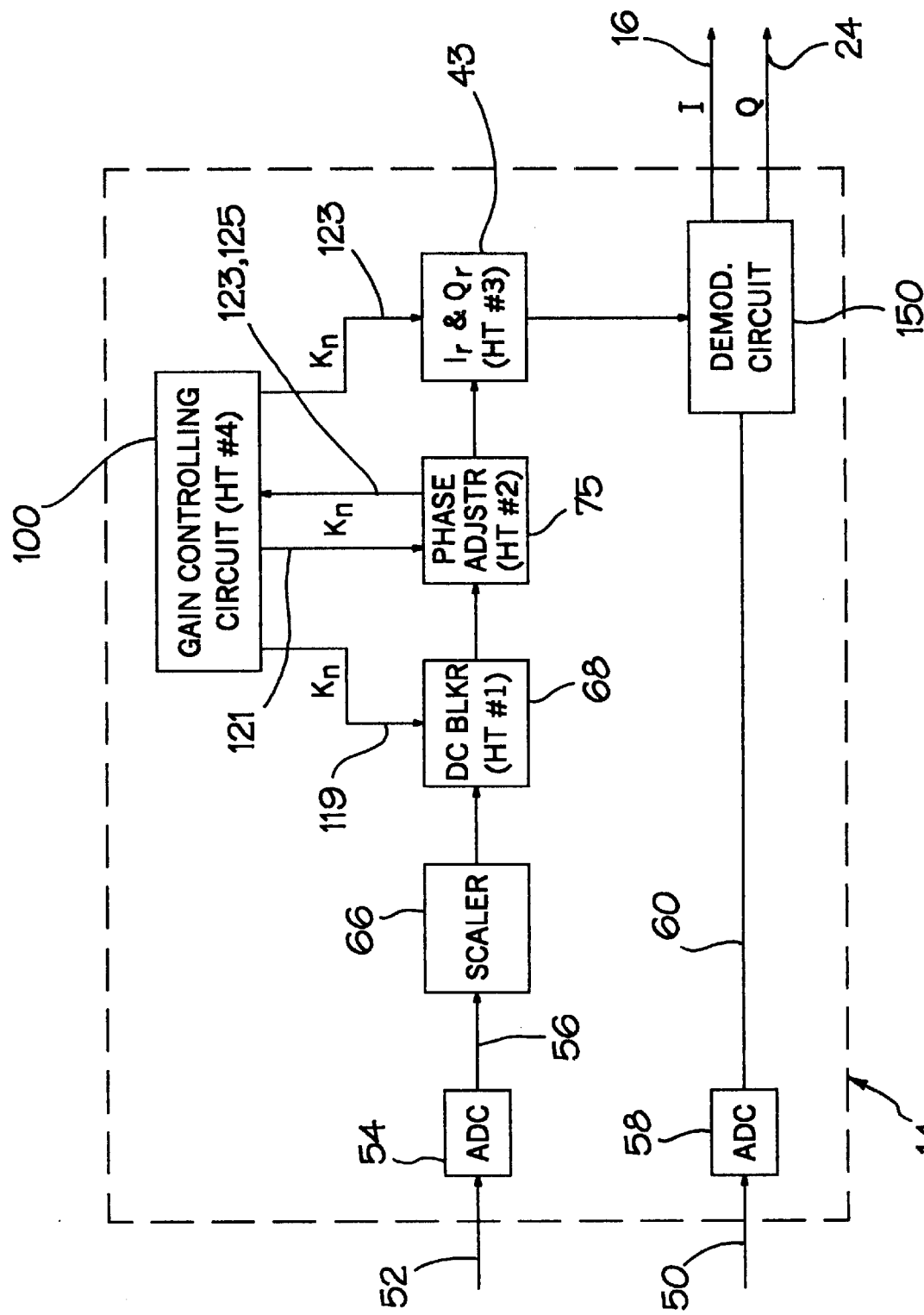
FIG. 2 is a block diagram of the present invention in operation, demodulating a modulated information signal.

FIG. 2 illustrates a schematic diagram of the demodulator 14 in accordance with the present invention. A resonator (not shown), which preferably comprises a solid-state gyroscope such as a quartz rate sensor, outputs an analog modulated information signal 50 and a drive current 52. The drive current 52, which drives the resonator, is digitally sampled by an analog-to-digital converter 54 to produce the demodulation-reference signal 56. As mentioned above, the demodulation-reference signal 56 will likely be degraded to some degree, having an undesired phase shift, for example.

In accordance with the presently preferred embodiment, the analog modulated information signal 50 from each QRS of a DQI comprises an analog modulated gyro-output signal having a frequency of about 10 kHz, and the drive current 52 comprises a sinusoidal demodulation-reference signal at a frequency of about 10 kHz. In the illustrated embodiment, the analog modulated information signal 50 is a double-sideband suppressed-carrier (DSSC) quadrature amplitude-modulated (QAM) in-phase body-rate signal with a quadrature component that carries diagnostic information and behaves nearly as a DSSC-modulated thermometer signal. These two QRS output signals 50, 52 are digitized by the respective 16-bit 42 k-sample/second analog-to-digital converters 58, 54. In the illustrated embodiment, each of the output signals 60, 56 comprises 16 bits, inclusive of the sign bit.

The analog-to-digital converters 54, 58 comprise the inputs for the digital complex demodulator 14 which, in many ways, is functionally equivalent to the demodulator disclosed in Applicant's U.S. Pat. No. 5,550,866, entitled "Digital Demodulation-Reference Signal Generator Having Direct-Current Blocker and First Hilbert Transformation with Quadrature Output Followed by Gain Staging and Combination for Second Hilbert Transformation Quadrature Output," the entire contents of which are expressly incorporated herein by reference.

The demodulator 14 converts to baseband the two DSSC signals which ride on the 10 kHz carrier. As mentioned above, in order to compensate for phase shifts that occur in the QRS instrument, the demodulation reference signal 56 must be phase shifted back an equal and opposite amount within the demodulator 14 to ensure that all rate information appears only on the demodulated I-channel output 16 and no rate information appears on the demodulated Q-channel output 24. That is, the in-phase channel (I-channel) should contain all of the sensed information, and the quadrature-phase channel (Q-channel) should contains none of it. If information gets through on both channels, then there will be a non-zero cross-correlation between the channels. When the cross-correlation is minimized, as is presently preferred, all of the sensed information will be in one channel, and diagnostic information will be in the other channel. The phase-shift-error problem can be substantially eliminated by combining with the demodulator an automatic phase-shift corrector; specifically, Applicant's invention disclosed in U.S. Pat. No. 5,764,705, entitled "Adaptive Phase-Shift Adjuster for Resonator," the entire contents of which are expressly incorporated herein by reference.

As presently embodied, the demodulation-reference signal 56 is ideally derived directly from the drive current 52 which drives the resonator. The output drive current is used because it is (ideally) in phase with the instantaneous velocity of the drive tines of the fork; therefore, it is in phase with the modulated angular rate of the QRS about its input axis. The output of the analog-to-digital converter 54 is applied to a scaler 66, which may comprise, for example, a multiplier having a second input, to which a fixed scaler multiplicand is applied. A bit shifter may be used, alternatively, especially, for example, in an ASIC implementation. The scaler multiplicand is selected to be small enough to prevent downstream devices from overflowing, yet large enough to allow the downstream devices to operate over their largest possible dynamic ranges. If the demodulation-reference signal 56 already meets these requirements, the scaler 66 may be omitted. In the presently preferred embodiment, the multiplicand applied to the scaler 66 is equal to about one-eighth.

Figure 3:
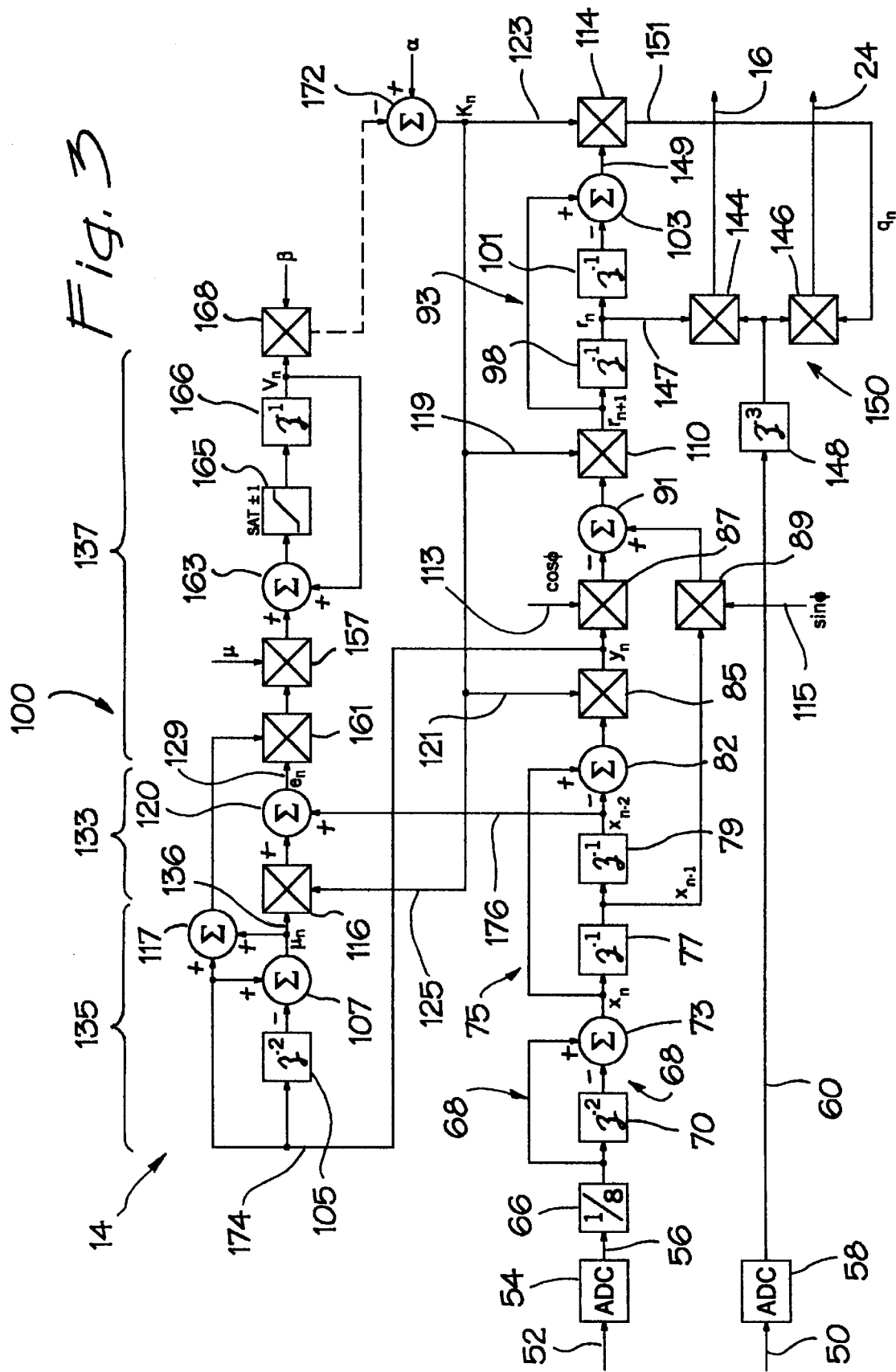
FIG. 3 is a block diagram depicting the demodulator of the presently preferred embodiment.

The output of the scaler 66 is applied to a direct-current blocker 68, which as presently embodied comprises a first Hilbert transformer. The preferred embodiment of the direct-current blocker 68 is shown in FIG. 3, comprising a 2-unit delay element 70 and a subtractor 73. The output of the scaler 66 is connected to an input of the 2-unit delay element 70 and to an additive input of the subtractor 73. The output of the 2-unit delay element 70 is connected to a subtractive input of the subtractor 73. It is possible to attempt to eliminate any direct-current offset from the input to the analog-to-digital converter 54, but the analog-to-digital converter 54 itself generates a non-negligible direct-current offset. It is more cost effective to eliminate both sources of direct-current offset with a downstream device.

The output of the direct-current blocker 68 is applied to a phase adjuster 75, which as presently embodied comprises a second Hilbert transformer. The preferred embodiment of the phase adjuster 75 is shown in FIG. 3, comprising a first 1-unit delay element 77, a second 1-unit delay element 79, a first subtractor 82, a first signal multiplier 87, a second signal multiplier 89 and a second subtractor 91. The first 1-unit delay element 77, the second 1-unit delay element 79 and the first subtractor 82 comprise the second Hilbert transformer.

An output $x_n$ from the subtractor 73 of the direct-current blocker 68 is connected to an input of the first 1-unit delay element 77 and to an additive input of the first subtractor 82. The output of the first 1-unit delay element 77 is connected to an input of the second 1-unit delay element 79 and to an input of the second signal multiplier 89. The output of the second 1-unit delay element 79 is connected to a subtractive input of the first subtractor 82 and to an input of a second adder 120 of a gain controlling circuit 100.

The output of the first subtractor 82 is connected to an input of a second gain-adjustment multiplier 85 (the first gain-adjustment multiplier 110 is discussed later), whose output, $y_n$, is connected to an input of the first signal multiplier 87, to an input of the 2-unit delay element 105, to an additive input of subtractor 107, and to an input of a first adder 117. An input 113 to the first signal multiplier 87 and an input 115 to the second signal multiplier 89 can be stored values, but preferably are obtained from an automatic phase shift corrector circuit within the phase angle computer 44 (FIG. 1). The output of the first signal multiplier 87 is connected to a subtractive input of the second subtractor 91, and an output of the second signal multiplier 89 is connected to an additive input of the second subtractor 91. The output of the second subtractor 91 is connected to an input of the first gain-adjustment multiplier 110 for adjusting the gain of the first Hilbert transformer 68.

It will be recalled that a function of the scaler 66 is to prevent overflow in the downstream components. Depending on the ratio of the sampling frequency to the demodulation frequency, this requirement may be relaxed. Components below the second Hilbert transformer (77, 79, 82) of the phase adjuster 75 may be protected by adjusting the inputs to the first and second signal multipliers 87, 89. The application to which the present invention is put may impose additional requirements on the multiplicands that are input to the scaler 66 and the inputs 113, 115 to the first and second signal multipliers 87, 89.

With particular reference to FIG. 2, the gain controlling circuit 100 of the present invention receives data from one or more other components and dynamically generates a gain factor to be applied to an output of at least one of the components of the system. The gain factor is dynamically generated by the gain controlling circuit 100 to maintain, during operation of the system, a gain of at least one of components of the system at a predetermined value.

In the illustrated embodiment, the gain controlling circuit 100 uses data related to both the gain of the second Hilbert transformer within the phase adjuster 75 and a fourth Hilbert transformer within the gain controlling circuit 100. More particularly, the gain controlling circuit 100 receives the signal $x_{n-2}$ from the second 1-unit delay element 79 of the phase shifter 75, via line 176, and receives the signal $y_n$ from the second gain-adjustment multiplier 85 of the phase shifter 75, via line 174.

As presently embodied, the gain factor is dynamically generated by the gain controlling circuit 100 to maintain, during operation of the system, a gain of each of the first, the second, a third and the fourth Hilbert transformers within a predetermined range and, preferably, at unity. During operation of the system, the gain controlling circuit 100 adjusts the gain of each of the first, second, third and fourth Hilbert transformers by multiplying the most recent version of the gain factor (dynamically-generated by the gain controlling circuit 100) with the outputs of each of the respective first, second, third and fourth Hilbert transformers.

With reference to FIG. 3, a gain-adjustment multiplier is disposed at the output of each of the first, second, third and fourth Hilbert transformers 68, (77, 79, 82), 93 and (105, 107), respectively. As mentioned, the first Hilbert transformer 68 comprises the 2-unit delay element 70 and the subtractor 73; and the second Hilbert transformer comprises the first 1-unit delay element 77, the second 1-unit delay element 79, and the subtractor 82. The third Hilbert transformer 93 comprises a first 1-unit delay element 98, a second 1-unit delay element 101, and a subtractor 103; and the fourth Hilbert transformer (105, 107) comprises a 2-unit delay element 105 and a subtractor 107.

The first gain-adjustment multiplier 110 operates to scale the gain of the first Hilbert transformer 68; and the second gain-adjustment multiplier 85 operates to scale the gain of the second Hilbert transformer (77, 79, 82). Similarly, a third gain-adjustment multiplier 114 operates to scale the gain of the third Hilbert transformer 93; and a fourth gain-adjustment multiplier 116 operates to scale the gain of the fourth Hilbert transformer (105, 107). In the presently preferred embodiment wherein Hilbert transformers are incorporated, and wherein a required gain adjustment to keep the gains of each of the Hilbert transformer at unity is the same for all of the Hilbert transformers, a single gain factor is dynamically computed for all four of the Hilbert transformers.

The first gain-adjustment multiplier 110 receives the gain factor from the gain controlling circuit 100 via line 119, and multiplies the gain factor with a version of the output of the subtractor 73 from the first Hilbert transformer 68. The second gain-adjustment multiplier 85 receives the gain factor from the gain controlling circuit 100 via line 121, and multiplies the gain factor with the output from the first subtractor 82 of the second Hilbert transformer (77, 79, 82). The third gain-adjustment multiplier 114 receives the gain factor from the gain controlling circuit 100 via line 123, and multiplies the gain factor with the output from the subtractor 103 of the third Hilbert transformer 93. Finally, the fourth gain-adjustment multiplier 116 receives the gain factor via line 125, and multiplies the gain factor with the output from the subtractor 107 of the fourth Hilbert transformer (105, 107). The products generated by the first gain-adjustment multiplier 110, the second gain-adjustment multiplier 85, the third gain-adjustment multiplier 114 and the fourth gain-adjustment multiplier 116 comprise gain-adjusted signals, which amplitudes should match the inputs of the respective first, second, third and fourth Hilbert transformers 68, (77, 79, 82), 93 and (105, 107) for a net gain of unity for each Hilbert transformer. Although unity gains are preferred for Hilbert transformers, other gains for the same or for other components may be controlled in modified embodiments of the present invention.

When the gains of the Hilbert transformers 68, (77, 79, 82), 93 and (105, 107) change with slight variations in frequency of the demodulation reference signal 56, the gain controlling circuit 100 detects the change or changes and adjusts the gain factor accordingly to maintain the unity gains of the Hilbert transformers 68, (77, 79, 82), 93 and (105, 107). As presently embodied, the gain controlling circuit 100 detects changes in the gains of the Hilbert transformers 68, (77, 79, 82), 93 and (105, 107) by monitoring the multiplied gains (product of the two gains) of any two of the Hilbert transformers 68, (77, 79, 82), 93 and (105, 107). It is least preferred that the gain of the first Hilbert transformer 68 be monitored in combination with another Hilbert transformer; and it is most preferred that the gains of the second and fourth Hilbert transformers (77, 79, 82) and (105, 107) be monitored by the gain controlling circuit 100 due to the resulting efficiency, compactness and small number of delays in the resulting circuit. In the presently preferred embodiment, the gain controlling circuit 100 monitors the gains of the second and fourth Hilbert transformers (77, 79, 82) and (105, 107).

In accordance with the present invention, the gain-controlling circuit 100 comprises a gain-error generator 133 constructed to generate a gain error, the gain error being indicative of whether a present value of the gain factor is correct, and further comprises an error-gradient generator 135 constructed to generate an error-gradient, the error-gradient being indicative of a gradient of the gain error with respect to the gain factor. The gain-controlling circuit 100 further comprises a correlator 137 constructed to compute a correlation between the gain error and the error-gradient with respect to the gain error and to output a correlator output; and comprises circuitry 110, 85, 114, 116, 119, 121, 123, 125 for adjusting gains of the Hilbert transformers. The circuitry adjusts the gains by multiplying a version of the correlator 137 output, which corresponds to the gain factor dynamically generated by the gain-controlling circuit 100, with the output(s) of the component(s) whose gain(s) is (are) to be adjusted, which as presently embodied comprises the outputs of the four Hilbert transformers 68, (77, 79, 82), 93 and (105, 107).

The input of each Hilbert transformer, of the four Hilbert transformers 68, (77, 79, 82), 93 and (105, 107), is a sinusoidal signal, $x_n$, whose frequency lies within a specified range. The input frequency is assumed to be fixed, or very slowly time varying. The sinusoidal signal at the output of the Hilbert transformer is defined generally as $y_n = K_n(x_n - x_{n-2})$. The gain, $K_n$, is equal to $1/[2 \sin(\omega_d T)]$, with $\omega_d$ being the frequency of the drive current 52 and T being the sampling period.

If the gain factor for the second Hilbert transformer (77, 79, 82), for example, is set by the gain-controlling circuit 100 to equal $K_n$, then multiplication of the gain factor with the actual output of the second Hilbert transformer (77, 79, 82) will yield a gain of j with a one unit delay. Further, when the fourth Hilbert transformer (105, 107), also having a gain of $K_n$, is placed in tandem with the second Hilbert transformer (77, 79, 82) and the output of the fourth Hilbert transformer (105, 107) is also multiplied with the same gain factor, the net gain will be −1 with a two unit delay. Accordingly, when the gain factor computed by the gain controlling circuit 100 is exactly correct, and a signal consisting solely of a two unit delay is summed with the net gain, the output ("error signal") is zero. In FIG. 3, the second adder 120 produces such an error signal 129 for proper $K_n$.

In the illustrated embodiment of FIG. 3, the error signal 129 is defined as:

$$e_n = x_{n-2} + K_n[K_n(x_n - x_{n-2}) - K_{n-2}(x_{n-2} - x_{n-4})]$$ Equation 3 where $K_n$ is the gain factor on lines 119, 121, 123, 125 and $x_n$ is the output from the subtractor 73.

In accordance with the present invention, the value of $K_n$ on lines 119, 121, 123, 125 is not changed by the gain controlling circuit 100 when the error signal 129 is zero, but is changed a small amount or a large amount, depending on the magnitude of the error signal, in order to bring the error signal back to zero. As presently embodied, a steep-descent gain-adjustment rule operating on a least mean-squared-error signal performance criterion is implemented to provide swift and accurate adjustment to the gain factor, when appropriate, to keep the error signal 129 near zero. In seeking to minimize the mean-squared value of $e_n$, an effective solution is to make an unbiased estimate that the mean-squared value of $e_n$ is $e_n^2$ itself. The adjustment size or amount of $K_n$ (which determines whether and how much the gain controlling circuit will change $K_n$) in a single period is set to be proportional to the negative of the partial derivative of $e_n^2$ with respect to $K_n$, or $-\mu e_n g_n$, where $\mu$ is a constant which controls the rate of convergence of the adaptive gain-computing process. The partial derivative of $e_n^2$ with respect to $K_n$ is $2e_n g_n$, where $g_n$ is the partial derivative of $e_n$ with respect to $K_n$. More particularly, the partial derivative of $e_n$ (Equation 3) with respect to $K_n$ is:

$$g_n = 2y_n - y_{n-2}$$ Equation 4 where $y_n$ is defined to equal $K_n(x_n - x_{n-2})$. It follows that:

$$g_n = y_n + (y_n - y_{n-2})$$ Equation 5 and it follows that:

$$g_n = y_n + u_n$$ Equation 6 when the variable $u_n$ 136 (FIG. 3) is defined to equal $y_n - y_{n-2}$. Referring to FIG. 3, one can see that $y_n$ is provided on line 174, and that the output $u_n$ of the subtractor 107 provided on line 136 is equal to $y_n - y_{n-2}$.

Accordingly, the gradient or partial derivative of $e_n$ with respect to $K_n$ is $y_n + u_n$, which is the output of the first adder 117 of FIG. 3.

As mentioned above, the adjustment size of $K_n$ in a single period is set to be proportional to the negative of the partial derivative of $e_n^2$ with respect to $K_n$, or $-\mu e_n g_n$, where $\mu$ is a constant. In FIG. 3, the multiplier 161 multiplies the error signal, $e_n$, with $g_n$ from the first adder 117, and the multiplier 157 scales the product with the constant $\mu$. As presently embodied, the actual output of the multiplier 161 is half the gradient of $e_n^2$, and the multiplier 157 scales the output by $\mu = 16/[\max(x_n)]2$. The integral or accumulation of this signal, suitably scaled and biased, yields the proper gain factor $K_n$.

Figure 7:
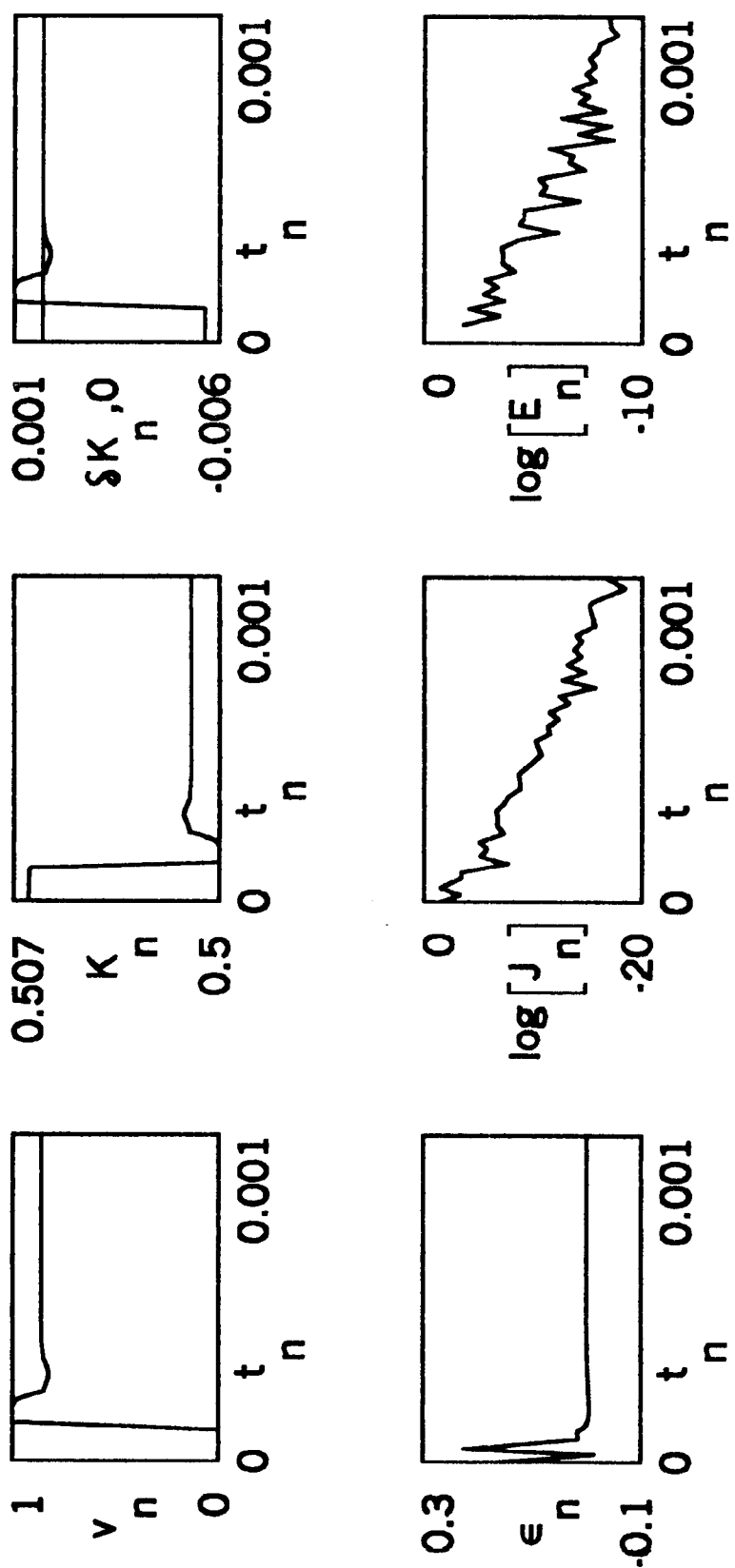
FIG. 7 illustrates plots of a Mathcad simulation of the demodulator circuit of the present invention.

The adder 163, saturation element 165, and 1-unit delay element 166 comprise an accumulator. The output of the saturation element 165 is 1 if its input is greater than 1, −1 if its input is less than −1, and equal to the input otherwise. The output, $v_n$, of the 1-unit delay element 166 is connected to an input of the adder 163 and is also scaled by β in scaling multiplier 168. The output of the scaling multiplier 168 is subtracted from a in the subtractor 172, whose output is the gain factor, $K_n$. The performance of this preferred embodiment of the automatic gain adjustment loop is described and demonstrated in detail in the section below entitled "DEMONSTRATION OF 'SMART' DEMODULATOR ADAPTION TO FREQUENCY." This section and the plots shown in FIG. 7 describe a Mathcad simulation of circuits 75 and 100.

An output of the first gain-adjusting multiplier 110, $r_{n+1}$, is connected to an input of the first 1-unit delay 98 of the third Hilbert transformer 93 and to an additive input of the subtractor 103 of the third Hilbert transformer 93. An output, $r_n$, of the first 1-unit delay 98 is connected to an input of the second 1-unit delay element 101 and to an input of the in-phase demodulator 144. The output of the second 1-unit delay 101 is connected to a subtractive input of the subtractor 103. An output of the subtractor 103 is connected to an input of the third gain-adjusting multiplier 114, which has an output connected to an input of the quadrature demodulator 146.

The third Hilbert transformer 93 operates as a quadrature-reference-signal generator, by generating the demodulation reference signals in quadrature. More particularly, the third Hilbert transformer 93 produces an in-phase output 147 and a quadrature output 149. As with the other Hilbert transformers, appropriate allowances are made for the gains generated in each path. As presently embodied, the in-phase output 147 will have a gain of one, and no correction is required. The in-phase output 147 is applied to an in-phase demodulator 144. The quadrature output 149, however, as with the second Hilbert transformer (77, 79, 82), for example, will have a gain of $2\sin(\omega_d T)$, which varies with the frequency $\omega_d$ of the drive current 52. The gain factor $K_n$ supplied from the gain controlling circuit 100, via line 123, to the third gain-adjustment multiplier 114 operates to maintain the gain of the third Hilbert transformer quadrature output 149 at unity. The output 151 of the third gain-adjustment multiplier 114 is applied to a quadrature demodulator 146.

The in-phase and quadrature demodulators 144, 146 of the demodulator circuit 150 produce the demodulated I channel output 16 and the demodulated Q channel output 24, respectively. The modulated information signal 60 is delayed by the compensating delay element 148, thereby matching the delay of the components of the demodulation-reference signal 56 path. As presently embodied, the path of the demodulation-reference signal 56 will have a delay of three sampling periods within the demodulator 14. Thus, the compensating delay element 148 is selected to impose the same three-sampling period delay in the path of the modulated information signal 60. The output of the compensating delay element 148 is applied to inputs of the in-phase demodulator 144 and the quadrature demodulator 146. These demodulators 144, 146 are driven respectively by the in-phase 147 and quadrature 151 components from the third Hilbert transformer 93 and the third gain-adjustment multiplier 114. The demodulators 144, 146 thereby produce in-phase 16 and quadrature 24 components of the demodulated signal.

Figure 4:
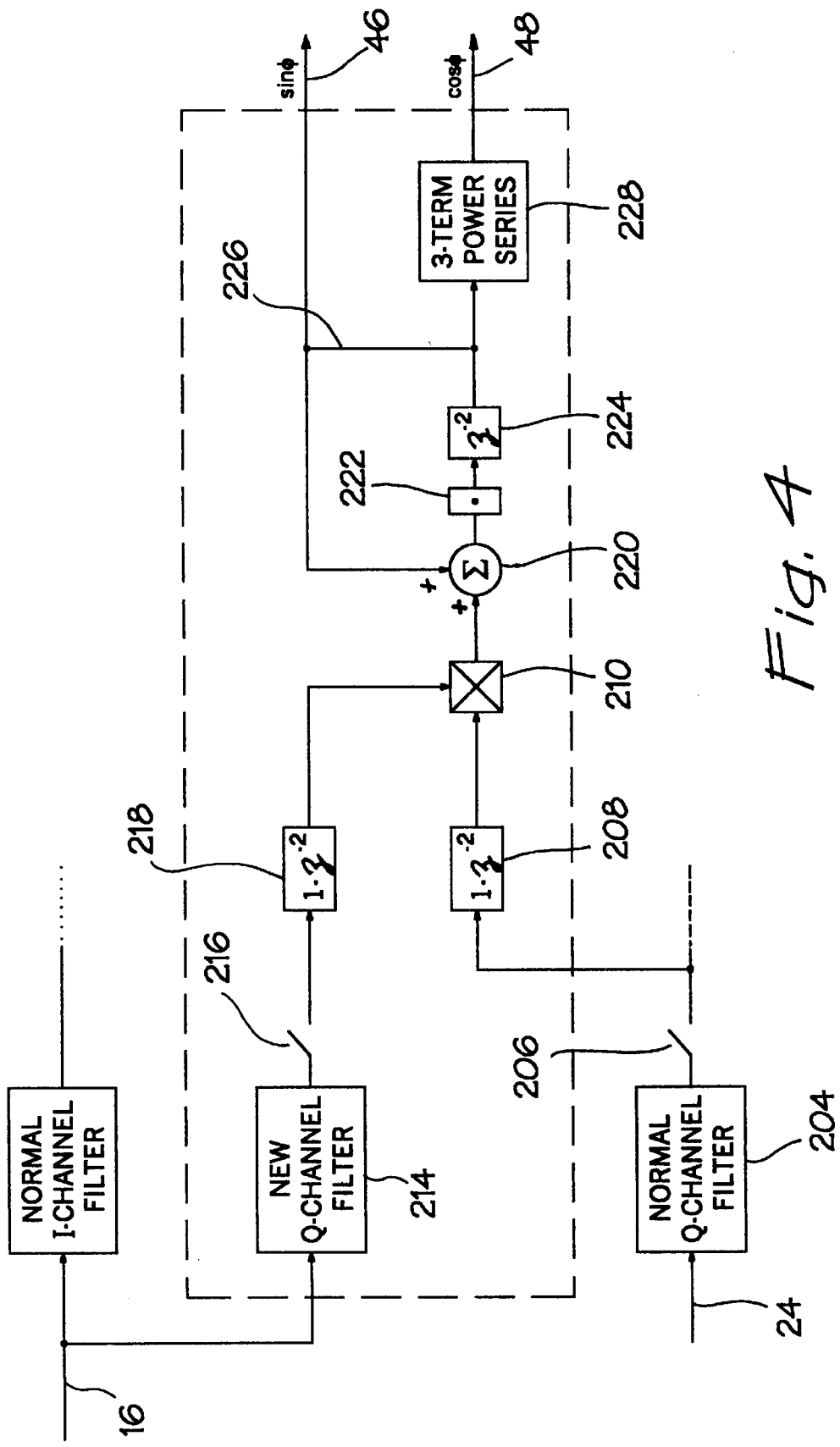
FIG. 4 is a block diagram of the decorrelator which provides the automatic phase adjustment, in accordance with the presently preferred embodiment.
Figure 8:
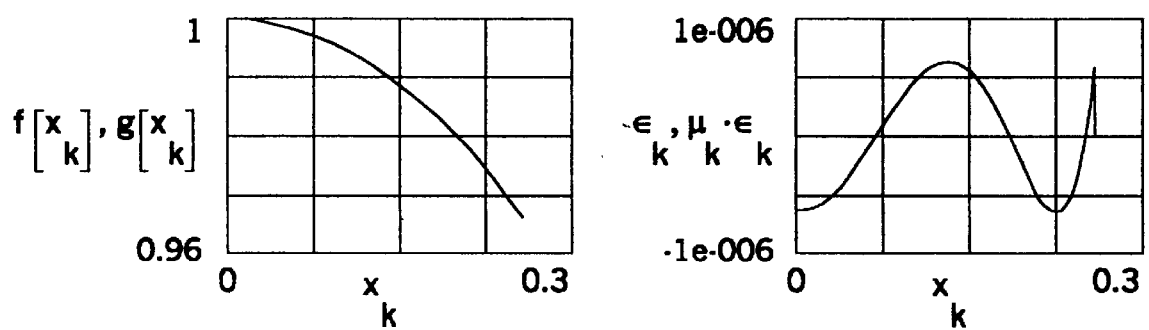
FIG. 8 illustrates plots relating to a Chebychev approximation program implemented for the function generator of the present invention.

FIG. 4 shows the generation of the sines and cosines of the automatic phase shift adjustment process. The Q channel output signal 24 is processed through its Q channel filter 204, then decimated to a 600 s/s data rate by downsampler 206. That signal is applied to direct-current blocker 208 whose output is connected to an input of multiplier 210. The I channel output signal 16 drives a new filter 214 which is identical to the Q channel filter 204. The output of 214 is decimated to 600 s/s by downsampler 216, passed through direct-current blocker 218, and connected to the second input of multiplier 210. The output of multiplier 210 is connected to an accumulator through the first input to adder 220. The output of adder 220 is connected to saturation element 222, whose output is connected to 1 unit delay element 224, whose output sin(φ) is connected to the second input of adder 220, to function generator 228, and to 115 in FIG. 3. Function generator 228 approximates cos(φ) with a peak error magnitude less than $10^{-6}$ by a power series $\cos(\phi)=a_0+\sin^2(\phi)[a_1+a_2 \sin^2(\phi)]$. The output 48 of function generator 228 is connected to 113 in FIG. 3. The presently preferred embodiment of the function generator 228 is discussed in detail in the section below entitled "CHEBYCHEV APPROXIMATION PROGRAM USING THE REMEZ-EXCHANGE ALGORITHM." This section and the plots shown in FIG. 8 describe a Chebychev approximation program which computes the coefficients implemented by the function generator 228 of the present invention.

Although an exemplary embodiment of the invention has been shown and described, many other changes, modifications and substitutions, in addition to those set forth in the above paragraphs, may be made by one having ordinary skill in the art without necessarily departing from the spirit and scope of this invention.

The Q-Channel Filter

This Q-channel filter design and performance analysis applies to all IMU-xx versions. The purpose of the Q channel filter is to accept data from the demodulator's Q-channel output at a 42 kHz sampling rate and provide suitable lowpass filtering so the output of the Q-channel filter may be subsampled at a 600 Hz rate with negligible foldover distortion and roundoff noise.

This Q-channel filter design has been a part of the baseline of the QRS processing for years. The design is based on an inverse Chebychev filter, modified to reduce the word-length sensitivity at the cost of a slight reduction of the passbandwidth. The passband gain drops to about −4 dB by 10 Hz, then monotonically drops to −90 dB at 300 Hz. The appended worst-case analysis shows that for the ASIC coefficient resolution of 15 bits, the peak stopband gain lies below −89.5 dB. For the SPROC coefficient resolution of 22 bits, the peak stopband gain is −90 dB. Performance difference is negligible.

The design details, frequency response, and block diagram are presented on the following pages.

The function of the Q-channel filter is simply to lowpass filter the Q-channel output from the demodulator so the output can be sampled at 600 s/s.

The Q-channel filter was designed in three steps. First, the unconstrained 3rd-order inverse-Chebychev filter that would satisfy performance requirements was determined. Next, the conjugate-complex pole pair was moved to the only real-pole location, so there was a third-order repeated real pole. Finally, the resulting filter was mechanized with tapped identical cascaded first-order allpass filter sections.

$f_s := 42000 \quad T := f_s^{-1}$   Sampling frequency and period.

$b := 15$   Coefficient amplitude resolution in bits.

$A_{sb} := -90$   Maximum stopband gain in dB.

$f_{sb} := 300$   Stopband edge frequency in Hz.

$N := 3 \quad n := 0 \ldots N-1$   Filter order and index.

Define two useful parameters, g and G(h,n). The inverse-Chebychev filter poles are G(g,n); the filter zeros are G(0,n).

$$g := [10^{-[0.1 \cdot A_{sb}]} - 1]^{0.5}$$

$$G(h, n) := \left[ \frac{\cos\left[\frac{\pi}{2} \cdot \frac{2 \cdot n + 1}{N} + \frac{j}{N} \cdot \operatorname{asinh}(h)\right] + j \cdot \tan[\pi \cdot f_{sb} \cdot T]}{\cos\left[\frac{\pi}{2} \cdot \frac{2 \cdot n + 1}{N} + \frac{j}{N} \cdot \operatorname{asinh}(h)\right] - j \cdot \tan[\pi \cdot f_{sb} \cdot T]} \right]$$

$P_n := G(g, n)$ $Z_n := G(0, n)$ $$P = \begin{vmatrix} 0.9988735207 + 0.0019491843j \\ 0.9977478581 \\ 0.9988735207 - 0.0019491843j \end{vmatrix}$$

$$Z = \begin{vmatrix} 0.9986576473 + 0.0517967511j \\ -1 \\ 0.9986576473 - 0.0517967511j \end{vmatrix}$$

Because we are not struggling to provide maximum passbandwidth and minimum phase shift on the Q channel, we can modify this filter to a somewhat simpler form with all real poles.

$HEXA := \operatorname{floor}\left[\frac{1}{2} + 2^b \cdot \operatorname{Re}[p_1]\right]$   The frequency of the real pole rounded to 15 amplitude bits and expressed in hexadecimal notation.

$HEXA = 32694$ $A := 2^{-b} \cdot HEXA$   $A = 0.9977416992$   The pole frequency in decimal format.

$R := \operatorname{Re}[z_0]$   $R = 0.9986576473$   The frequency of the real component of the conjugate complex zeros.

$K := \frac{1}{2} \cdot \frac{(1-A)^3}{1-R}$   The allpass filter section has a protective gain of 1/2 in front. This scaling restores overall unity gain.

Now we compute the tap weights of the allpass sections:

$$M := \begin{bmatrix} 1 & -A & A^2 & -A^3 \\ -3 \cdot A & [1+2 \cdot A^2] & -[2 \cdot A + A^3] & 3 \cdot A^2 \\ 3 \cdot A^2 & -[2 \cdot A + A^3] & [1+2 \cdot A^2] & -3 \cdot A \\ -A^3 & A^2 & -A & 1 \end{bmatrix} \quad v := K \cdot \begin{bmatrix} 1 \\ 1-2 \cdot R \\ 1-2 \cdot R \\ 1 \end{bmatrix}$$

$$c := M^{-1} \cdot v$$

We can take advantage of the symmetry of tap weights and mechanize only the first one. Proper weighting is then obtained by simply summing and differencing.

$$c = \begin{bmatrix} 0.2504756613 \\ 0.7495243437 \\ 0.7495243437 \\ 0.2504756613 \end{bmatrix}$$

As before, we convert to HEX format, then back to decimal for verification:

$HEXB := floor[0.5 + 2^b \cdot c_0]$ $B := 2^{-b} \cdot HEXB$ $K := 1000 \quad k := 0 \ldots K$ $f_k := \exp\left[\dfrac{k}{K} \cdot \ln[0.5 \cdot f_s]\right]$ $z := \overline{\exp(2j \cdot \pi \cdot f \cdot T)}$ $APF := \overline{\left[\dfrac{z^{-1} - A}{1 - A \cdot z^{-1}}\right]}$ $H := 0.5 \cdot \overline{[B \cdot [[1 + APF^3] - [APF + APF^2]] + [APF + APF^2]]}$ $HdB := 20 \cdot \text{Re}[\overline{\log(H)}]$ $HEXB = 2010h$ $B = 0.2504882813$ Frequency-display index.

Analysis frequencies.

Discrete-time Laplace variable.

The allpass filter section is APF. By combining several, we obtain our overall filter transfer function, H. We also express it in dB for easy display and interpretation.

The actual stopband edge frequency is:

$F_k := [f_k < 300] \cdot [HdB_k > -90] \cdot f_k$ $\max(F) = 296.6944596714$

The actual maximum stopband gain in dB is:

$HPK_k; := \text{if } [f_k \leq \max(F), -150, HdB_k]$ $\max(HPK) = -89.5798870824$ Close enough!

of the allowable frequency range, the allowable frequency range contains ¼ the sampling frequency, and the initial condition of the correlator that's supposed to figure things out is set at zero. In short, it's the worst combination of circumstances. Nontheless, the circuit adapts within about ¼ ms.

Sampling frequency and period: $f_s := 42000 \quad T := \dfrac{1}{42000}$

Maximum and minimum demodulation-reference frequencies over which the demodulator is expected to work

END OF PROGRAM

Demonstration of "Smart" Demodulator Adaption to Frequency

The purpose of the program is to demonstrate the rapid and accurate adaption of the proposed demodulator modification to the frequency of the reference signal. An example is presented where the input frequency is near one extreme (these aren't magic numbers, but they are reasonsable, and I needed numerical values) are:

$f_{max} := 11000 \quad f_{min} := 9000$

The corresponding maximum and minimum values of the gain to be "learned" by the demodulator lies between these limits:

$K_{min} := \text{if}\left[\left[f_{max} \geq \dfrac{1}{4} \cdot f_s\right] \cdot \left[f_{min} \leq \dfrac{1}{4} \cdot f_s\right], \dfrac{1}{2}, \dfrac{1}{2} \cdot \left[\max\begin{bmatrix} \sin[2 \cdot \pi \cdot f_{min} \cdot T] \\ \sin[2 \cdot \pi \cdot f_{max} \cdot T] \end{bmatrix}\right]^{-1}\right]$ $K_{max} := \dfrac{1}{2} \cdot \left[\min\begin{bmatrix} [\sin 2 \cdot \pi \cdot f_{min} \cdot T] \\ [\sin 2 \cdot \pi \cdot f_{max} \cdot T] \end{bmatrix}\right]^{-1}$ $K_{max} = 0.5128584316$ $K_{min} = 0.5$ This is a narrow range. We want the accumulator of the correlator have its full dynamic range (+1 to −1) available. The parameter that we'll compute within the accumulator is Define: SAT(x):=if(x>1,1,if(x<−1,−1,x)) and $\delta := 10^{-24}$ where $\delta$ is the antisingularity insurance. The system equations are the following $$K_n := \alpha - \beta \cdot v_{n-1} \circ \quad \text{This relates the gain value to the correlator output.}$$

$$\epsilon_n := x_{n-2} + K_n \cdot [K_n \cdot [x_n - x_{n-2}] - K_{n-2} \cdot [x_{n-2} - x_{n-4}]] \circ \quad \text{The error.}$$

$$g_n := 2 \cdot K_n \cdot [x_n - x_{n-2}] - K_{n-2} \cdot [x_{n-2} - x_{n-4}] \circ \quad \text{The error gradient wrt the gain.}$$

$$v_n := SAT[v_{n-1} + g_n \cdot \epsilon_n] \circ \quad \text{The correlation of the error and the error gradient.}$$

$$\mu := 16 \cdot A^{-2} \quad \text{The convergence factor.}$$

v. By scaling and biasing v we get our gain, K, so K=α−βv, where the bias (α) and scaling (β) values are:

$$\alpha := \frac{1}{2} \cdot [K_{max} + K_{min}] \quad \beta := \frac{1}{2} \cdot [K_{max} - K_{min}]$$

$$\alpha = 0.5064292158 \quad \beta = 0.0064292158$$

Sample index and time base to be used in the demonstration are:

$$N := 42 \quad n := 0 \ldots N \quad t_n := n \cdot T \quad \max(t) = 0.001$$

The demodulator reference signal with an arbitrarily chosen frequency (I decided to use a value near the top end of the frequency range) is:

$$f_o := 10900 \quad A := 1 \quad x_n := A \cdot \cos[2 \cdot \pi \cdot f_o \cdot n \cdot T]$$

The ideal gain value is: $K' := \dfrac{1}{2 \cdot \sin[2 \cdot \pi \cdot f_o \cdot T]}$ or $K' = 0.5008965398$ Consider the elemental Hilbert transformer: H(z):=K·[1−z⁻²]□ To a sinusoidal input it provides a gain, a unit of delay, and a −90-degree phase shift. Two such units in tandem provide a gain, two units of delay and a −180-degree phase shift. We should be able run a sinusoid to a system consisting of two paths: one path consists of 2 elemental transformers; the other path consists of two sample periods of delay. We sum the signals from the two paths and adjust the gains, K, until the output is zero. That guaratees unity gain through the Hilbert transformers. We can treat the summed signal as an error and apply the LMS algorithm in order to dynamically adapt the gain(s).

After expanding the above equations, we find that the system equation to be solved is shown below. Set the correlator initial condition: v:=0

$$v_{n+1} := (n \geq 4) \cdot$$

$$SAT \left[ v_n + \mu \cdot \begin{bmatrix} x_{n-2} \cdot \begin{bmatrix} 2 \cdot [\alpha - \beta \cdot v_n] \cdot [x_n - x_{n-2}] \ldots + \\ [\alpha - \beta \cdot v_{n-2}] \cdot [x_{n-4} - x_{n-2}] \end{bmatrix} \ldots + \\ 2 \cdot [\alpha - \beta \cdot v_n]^3 \cdot [x_n - x_{n-2}]^2 \ldots + \\ -3 \cdot [\alpha - \beta \cdot v_n]^2 \cdot [\alpha - \beta \cdot v_{n-2}] \cdot [x_n - x_{n-2}] \cdot [x_{n-2} - x_{m-4}] + \\ [\alpha - \beta \cdot v_n] \cdot [\alpha - \beta \cdot v_{n-2}]^2 \cdot [x_{n-2} - x_{n-4}]^2 \end{bmatrix} \right]$$

In order to evaluate the performance we can compute all kinds of stuff, like:

$$K_n := \alpha - \beta \cdot v_n \quad \delta K_n := K' - K_n \quad \text{The computed gain and gain error} \ldots$$

$$y_n := K_n \cdot [x_n - (n \geq 2) \cdot x_{n-2}] \quad \ldots \text{the ETH output} \ldots$$

$$\epsilon_n := (n \geq 2) \cdot x_{n-2} + K_n \cdot [y_n - (n \geq 2) \cdot y_{n-2}] \quad \ldots \text{the error function} \ldots$$

$$g_n := 2 \cdot y_n - (n \geq 2) \cdot y_{n-2} \quad \ldots \text{the error gradient} \ldots$$

$$J_n := \epsilon_n^2 + \delta \quad \ldots \text{the performance criterion} \ldots$$

$$E_n := (n \geq 2) \cdot [A^2 - [x_{n-1}^2 + K_n^2 \cdot [x_n - x_{n-2}]^2]] + \delta \quad \ldots \text{the ripple test} \ldots$$

The plots below show the behavior of the circuit during the first millisecond of operation.

With the no-brainer (zero) initial accumulator setting, for all practical purposes the adaption time for a worst-case frequency input is complete within about ¼ to ⅓ ms. That's pretty damned good!

End of Exercise

Chebychev Approximation Program Using the Remez-Exchange Algorithm

The objective of this program is to calculate the N "a" coefficients of f(x) that provides the Chebychev polynomial approximation to g(x); i.e.:

$$f(x) := \sum_n a_n \cdot x^{2 \cdot x} \circ \quad g(x) := \sqrt{1 - x^2}$$

The Chebychev solution is the one which minimizes the maximum error of the approximation fit. There are no "surprise points" in the solution space.

Initialize

Range of the input variable.

$$x_{max} := \sin\left[15 \cdot \frac{\pi}{180}\right] \qquad x_{min} := 0$$

$N := 3$  Number of coefficients in data-fitting routine.

$n := 0 \ldots N \quad m := 0 \ldots N$  Parameter-vector ("a" coefficients plus error limit) index, n; and the x-value index, m.

$p := 0 \ldots N - 1$  The weighting-coefficient ("a") index.

$K := 1000 \quad k := 0 \ldots K$  Performance-evaluation index.

$i := 0 \ldots 1$  A useful matrix column index.

$ZERO_m := 0$  It's convenient to define a "zero" vector.

PRINTCOLWIDTH:=10
PRNPRECISION:=10 Two write-to-file instructions and some housekeeping operations.
WRITE(COUNT):=0 □
ITERATION:=READ(COUNT)
XA:=(ITERATION≈0)·ZERO+(ITERATION−0)· READPRN(XA)
WRITE(COUNT):=1+ITERATION

Setup $$X_m := \text{if}\left[\text{ITERATION} \approx 0, X_{min} + [X_{max} - X_{min}] \cdot \frac{m}{N}, XA_m\right]$$  The extremal values of the independent variable, x.

$$W(X) := 1 \quad R_{m,n} := \text{if}\left[n \approx N, (-1)^m \cdot W[X_m]^{-1}, X_m^{2 \cdot n}\right]$$  The error-weighting vector and the Remez matrix.

$$x_k := X_{min} + [X_{max} - X_{min}] \cdot \frac{k}{K}$$  The performance-evaluation variable.

$$v := R^{-1} \cdot \overline{g(X)} \quad a_p := v_p \quad \delta := v_N$$  v is the parameter vector, the coefficients are the "a" vector, $\delta$ is the error limit.

$$f(x) := \sum_p a_p \cdot x^{2 \cdot p}$$  The approximating function.

Performance Evaluation $\epsilon := \overline{((f(x) - g(x)) \cdot W(x))}$  The performance error.

Define MAX: MAX(a, b, c) := $(a < b) \cdot (c < b) + (a > b) \cdot (c > b)$

Now we can find the locations and numbers of the extrema:

$\mu_k := (k \approx 0) + (k \approx K) + (k > 0) \cdot (k < K) \cdot \text{MAX}[\epsilon_{k-1}, \epsilon_k, \epsilon_{k+1}]$   $\sum \mu = 4$ $M'_{k,0} := x_k \cdot \mu_k \quad M'_{k,1} := |\epsilon_k| \cdot \mu_k$  Location and magnitudes of the extrema.

$M_{n,i} := (reverse(csort(M', 1)))_{n,i}$  Collect the N largest errors and their locations.

$WRITEPRN(XA) := reverse[sort[M^{\langle 0 \rangle}]]$  Write the locations of the N largest errors into memory for the next iteration.

READ(COUNT) = 4

Error distribution:   $MD := csort(M, 0)$

LOCATION     SIZE $$MD = \begin{vmatrix} 0 & 0.0000006398 \\ 0.1301859797 & 0.0000006398 \\ 0.2246549311 & 0.0000006398 \\ 0.2588190451 & 0.0000006398 \end{vmatrix}$$

THE COEFFICIENT VECTOR $$a = \begin{vmatrix} 0.9999993602 \\ -0.4998305275 \\ -0.131615415 \end{vmatrix}$$

END OF PROGRAM

What is claimed is:

1. An apparatus for complex demodulating a modulated information signal with a demodulation-reference signal, the apparatus comprising:
   (a) a phase adjuster constructed to receive a digitized version of the demodulation-reference signal, the phase adjuster comprising a first Hilbert transformer and being constructed to apply a phase angle shift to the digitized version of the demodulation-reference signal;
   (b) a second Hilbert transformer having an input that is operatively coupled to the phase adjuster, the second Hilbert transformer being constructed to generate an in-phase output signal and a quadrature output signal;
   (c) a gain-controlling circuit constructed to dynamically generate a gain factor to be applied to an output of at least one Hilbert transformer of the apparatus, the gain factor being dynamically generated by the gain-controlling circuit to maintain, during operation of the apparatus, a gain of the at least one Hilbert transformer of the apparatus at a predetermined value; and
   (d) a demodulator comprising:
      (1) a compensating delay element connected to receive a digitized version of the modulated information signal and to match a delay of elements (a) through (c) imposed by the apparatus; and
      (2) a pair of multipliers operatively coupled to the compensating delay element, the pair of multipliers being constructed to perform complex demodulation of the digitized version of the modulated information signal, using the in-phase output and the quadrature output from the second Hilbert transformer.

2. The apparatus as set forth in claim 1, wherein the gain factor is dynamically generated by the gain-controlling circuit to maintain, during operation of the apparatus, a gain of the at least one Hilbert transformer of the apparatus at unity.

3. The apparatus as set forth in claim 1, wherein:
   the modulated information signal comprises a first double-sideband suppressed carrier (DSSC) signal; and
   the demodulation-reference signal comprises a single-frequency demodulation-reference signal.

4. The apparatus as set forth in claim 1, wherein the apparatus further comprises:
   a first analog-to-digital converter connected to receive the demodulation-reference signal and to generate the digitized version of the demodulation-reference signal; and
   a second analog-to-digital converter connected to receive the modulation information signal and to generate the digitized version of the modulation information signal;
   an adjustable amplitude-scaler connected to receive the digitized version of the demodulation-reference signal and to apply a scaling factor thereto.

5. The apparatus as set forth in claim 4, wherein the apparatus further comprise a direct current (d.c.) blocker before the adjustable amplitude-scaler and the first Hilbert transformer, the direct-current blocker being constructed to block any direct-current component from the first Hilbert transformer.

6. The apparatus as set forth in claim 5, wherein the direct-current blocker comprises:
   (a) a double-delay element connected to receive an input signal to the direct-current blocker and to produce an output signal; and
   (b) a subtractor connected to:
      (1) receive, at a minus terminal, the output signal of the double-delay element;
      (2) receive, at a plus terminal, the input signal to the direct-current blocker; and
      (3) produce, at an output terminal, a difference signal which is the output of the direct-current blocker.

7. The apparatus as set forth in claim 6, wherein the apparatus further comprises a multiplier connected to multiply a version of the output of the direct-current blocker with a multiplicand, which is equal to the gain factor, to thereby produce a gain-adjusted signal.

8. The apparatus as set forth in claim 7, wherein an input terminal of the multiplier, which is connected to multiply a version of the output of the direct-current blocker with a multiplicand, is operatively coupled to receive, at an input terminal of the multiplier, an output signal from the phase adjuster.

9. The apparatus as set forth in claim 7, wherein the gain-controlling circuit comprises:
   (1) a gain-error generator constructed to generate a gain error, the gain error being indicative of whether a present value of the gain factor is correct;
   (2) an error-gradient generator constructed to generate an error-gradient, the error-gradient being indicative of a gradient of the gain error with respect to the gain factor;
   (3) a correlator constructed to compute a correlation between the gain error and the error-gradient with respect to the gain error, and further being adapted to output a correlator output; and
   (4) circuitry for adjusting a gain of the output of the direct-current blocker, the circuitry adjusting the gain by multiplying a version of the correlator output, which corresponds to the gain factor dynamically generated by the gain-controlling circuit, with a version of the output of the direct-current blocker.

10. The apparatus as set forth in claim 1, wherein:
    (a) the phase adjuster further comprises a first multiplier, a second multiplier and a first subtractor;
    (b) the first Hilbert transformer of the phase adjuster is connected to receive an input signal, and is further connected to generate both a first output signal and a second output signal, the first Hilbert transformer comprising:
       (1) a first delay element connected to:
          (i) receive the input signal to the first Hilbert transformer; and
          (ii) produce an output signal which is the first output signal of the first Hilbert transformer;
       (2) a second delay element connected to:
          (i) receive, as an input signal, the output signal of the first delay element; and
          (ii) produce an output signal which is the second output signal; and
       (3) a second subtractor connected to:
          (i) receive, at a plus terminal, the input signal to the first Hilbert transformer;
          (ii) receive, at a minus terminal, the output signal of the second delay element; and
          (iii) produce, at an output terminal, a difference signal which is the second output signal of the first Hilbert transformer.

11. The apparatus as set forth in claim 10, wherein:
    (a) the first multiplier is connected to multiply the first output signal with a multiplicand which is equal to the sine of a desired angle, to thereby produce a first product;
    (c) the second multiplier is connected to multiply the second output signal with a multiplicand which is equal to the cosine of the desired angle, to thereby produce a second product;

(d) the first subtractor is connected to subtract the second product from the first product, to thereby produce a difference signal.

12. The apparatus as set forth in claim 11, wherein the apparatus further comprises a gain-adjustment multiplier connected to multiply the difference signal of the first Hilbert transformer with a multiplicand, which is equal to the gain factor, to thereby produce a gain-adjusted signal.

13. The apparatus as set forth in claim 12, wherein the gain-adjustment multiplier, which is connected to multiply the difference signal of the first Hilbert transformer with a multiplicand, is operatively coupled between the first subtractor of the phase adjuster and the second subtractor of the first Hilbert transformer.

14. The apparatus as set forth in claim 12, wherein the gain-controlling circuit comprises:

(1) a gain-error generator constructed to generate a gain error, the gain error being indicative of whether a present value of the gain factor is correct;

(2) an error-gradient generator constructed to generate an error-gradient, the error-gradient being indicative of a gradient of the gain error with respect to the gain factor;

(3) a correlator constructed to compute a correlation between the gain error and the error-gradient with respect to the gain error, and further being adapted to output a correlator output; and (4) circuitry for adjusting a gain of the difference signal of the first Hilbert transformer, the circuitry adjusting the gain by multiplying a version of the correlator output, which corresponds to the gain factor dynamically generated by the gain-controlling circuit, with the difference signal of the first Hilbert transformer.

15. The apparatus as set forth in claim 1, wherein the second Hilbert transformer comprises:

(a) a first delay element operatively coupled to the first Hilbert transformer, the first delay element being connected to produce an output signal which is the in-phase output signal of the second Hilbert transformer;

(b) a second delay element connected to receive, as an input signal, the output signal of the first delay element, and further being connected to produce an output signal; and (c) a subtractor connected to:
  (1) receive, at a plus terminal, the input signal to the second Hilbert transformer;
  (2) receive, at a minus terminal, the output signal of the second delay element; and
  (3) produce, at an output terminal, a difference signal which is the quadrature output signal of the second Hilbert transformer.

16. The apparatus as set forth in claim 15, wherein:
(a) the pair of multipliers of the demodulator comprises an in-phase demodulator multiplier and a quadrature demodulator multiplier;
(b) the in-phase demodulator multiplier is connected to receive, as an input, the in-phase output signal of the second Hilbert transformer; and
(c) the quadrature demodulator multiplier is connected to receive, as an input, a version of the quadrature output signal of the second Hilbert transformer.

17. The apparatus as set forth in claim 16, wherein the apparatus further comprises a gain-adjustment multiplier connected to multiply the quadrature output signal of the second Hilbert transformer with a multiplicand, which is equal to the gain factor, to thereby produce a gain-adjusted signal.

18. The apparatus as set forth in claim 17, wherein the gain-controlling circuit comprises:

(1) a gain-error generator constructed to generate a gain error, the gain error being indicative of whether a present value of the gain factor is correct;

(2) an error-gradient generator constructed to generate an error-gradient, the error-gradient being indicative of a gradient of the gain error with respect to the gain factor;

(3) a correlator constructed to compute a correlation between the gain error and the error-gradient with respect to the gain error, and further being adapted to output a correlator output; and (4) circuitry for adjusting a gain of the quadrature output of the second Hilbert transformer, the circuitry adjusting the gain by multiplying a version of the correlator output, which corresponds to the gain factor dynamically generated by the gain-controlling circuit, with the quadrature output of the second Hilbert transformer.

19. The apparatus as set forth in claim 18, wherein:
(a) the pair of multipliers of the demodulator comprises an in-phase demodulator multiplier and a quadrature demodulator multiplier;
(b) the in-phase demodulator multiplier is connected to receive, as an input, the in-phase output signal of the second Hilbert transformer; and
(c) the quadrature demodulator multiplier is connected to receive, as an input, a version of the quadrature output signal of the second Hilbert transformer.

20. The apparatus as set forth in claim 1, wherein the gain-controlling circuit comprises:

(1) a gain-error generator constructed to generate a gain error, the gain error being indicative of whether a present value of the gain factor is correct;

(2) an error-gradient generator constructed to generate an error-gradient, the error-gradient being indicative of a gradient of the gain error with respect to the gain factor;

(3) a correlator constructed to compute a correlation between the gain error and the error-gradient with respect to the gain error, and further being adapted to output a correlator output; and (4) circuitry for applying the correlator output to the output of the at least one Hilbert transformer of the apparatus.

21. The apparatus as set forth in claim 20, wherein:
(a) the gain-controlling circuit further comprises a third Hilbert transformer, the third Hilbert transformer comprising at least a portion of the gain-error generator and the error-gradient generator;
(b) the third Hilbert transformer is connected to receive an input signal to the third Hilbert transformer, and to produce an output signal, the third Hilbert transformer comprising:
  (1) a double-delay element connected to receive the input signal to the third Hilbert transformer and to produce an output signal; and
  (2) a subtractor connected to:
    (i) receive, at a minus terminal, the output signal of the double-delay element;
    (ii) receive, at a plus terminal, the input signal to the third Hilbert transformer; and
    (iii) produce, at an output terminal, a difference signal which is the output signal of the third Hilbert transformer.

22. The apparatus as set forth in claim 21, wherein:
(a) the first Hilbert transformer of the phase adjuster is connected to receive an input signal, and is further connected to generate both a first output signal and a second output signal, the first Hilbert transformer comprising:
   (1) a first delay element connected to:
      (i) receive the input signal to the first Hilbert transformer; and
      (ii) produce an output signal which is the first output signal of the first Hilbert transformer;
   (2) a second delay element connected to:
      (i) receive, as an input signal, the output signal of the first delay element; and
      (ii) produce an output signal which is the second output signal; and
   (3) a second subtractor connected to:
      (i) receive, at a plus terminal, the input signal to the first Hilbert transformer;
      (ii) receive, at a minus terminal, the output signal of the second delay element; and
      (iii) produce, at an output terminal, a difference signal which is the second output signal of the first Hilbert transformer; and
(b) the gain-controlling circuit is driven by:
   (1) the output signal from the second delay element of the second Hilbert transformer; and
   (2) a gain-adjusted version of the quadrature output signal of the second Hilbert transformer.

23. The apparatus as set forth in claim 21, wherein the apparatus further comprises a gain-adjustment multiplier connected to multiply the second output signal of the third Hilbert transformer with a multiplicand, which is equal to the gain factor, to thereby produce a gain-adjusted signal.

24. The apparatus as set forth in claim 23, wherein:
(a) the phase adjuster is constructed to output an intermediate signal, which corresponds to a delayed version of the digitized version of the demodulation-reference signal that is input to the phase adjuster;
(b) the gain-controlling circuit further comprises:
   (1) a first adder connected to receive both:
      (i) the input signal to the third Hilbert transformer; and
      (ii) the output signal of the third Hilbert transformer;
   (2) a second adder connected to receive both:
      (i) a version of the output signal of the third Hilbert transformer; and
      (ii) the intermediate signal from the phase adjuster; and
   (3) a correlator.

25. The apparatus as set forth in claim 24, wherein:
(a) the first Hilbert transformer of the phase adjuster is connected to receive an input signal, and is further connected to generate both a first output signal and a second output signal, the first Hilbert transformer comprising:
   (1) a first delay element connected to:
      (i) receive the input signal to the first Hilbert transformer; and
      (ii) produce an output signal which is the first output signal of the first Hilbert transformer;
   (2) a second delay element connected to:
      (i) receive, as an input signal, the output signal of the first delay element; and
      (ii) produce an output signal which is the second output signal; and
   (3) a subtractor connected to:
      (i) receive, at a plus terminal, the input signal to the first Hilbert transformer;
      (ii) receive, at a minus terminal, the output signal of the second delay element; and
      (iii) produce, at an output terminal, a difference signal which is the second output signal of the first Hilbert transformer; and
(b) the intermediate signal from the phase adjuster is the output signal from the second delay element of the first Hilbert transformer.

26. The apparatus as set forth in claim 24, wherein the third Hilbert transformer, the first adder and the second adder comprise the error-gradient generator and the error-function generator.

27. The apparatus as set forth in claim 26, wherein:
the correlator comprises a multiplier and an accumulator; and
the accumulator comprises a two-input adder, a saturation element, and a delay element.

28. The apparatus as set forth in claim 26, wherein the correlator forms the correlation of the error gradient and the error function, the correlator comprising:
a first correlator multiplier connected to receive, at a first input, an output of the first adder, the output of the first adder being equal to a sum of the input signal to the third Hilbert transformer and the output signal of the third Hilbert transformer, and to receive at a second input a sum of a version of the output signal of the third Hilbert transformer and the intermediate signal from the phase adjuster, the first correlator multiplier further being connected to generate a first-correlator multiplier output; and
a second correlator multiplier connected to receive, at a first input, the output signal of the first correlator multiplier, and to receive, at a second input, a constant, the second correlator multiplier further being connected to generate a second-correlator multiplier output; and
an accumulator.

29. The apparatus as set forth in claim 28, wherein the accumulator comprises:
an accumulator delay element having an output; and
a summer connected to, at a first input, the second-correlator multiplier output and to, at a second input, the output of the accumulator delay element, the summer further having an output operatively coupled to the accumulator delay element.

30. The apparatus as set forth in claim 29, wherein the summer of the accumulator is operatively coupled to the accumulator delay element via a saturation element, the saturation element of the accumulator being symmetrically hard limited between a first numerical value and a second numerical value.

31. The apparatus as set forth in claim 30, wherein the apparatus further comprises:
a scaling element coupled to the output of the accumulator delay element; and
an offsetting element coupled to the scaling element, wherein the scaling element multiplies the correlator output with a scaling value to generate a product and, subsequently, the offsetting element adds an offset value to the product, to thereby generate the gain factor.

32. The apparatus as set forth in claim 31, wherein the apparatus further comprises:

(a) a first analog-to-digital converter connected to receive the demodulation-reference signal and to generate a digitized version of the demodulation-reference signal; and (b) a second analog-to-digital converter connected to receive the demodulation-reference signal and to generate a digitized version of the demodulation-reference signal;

(c) an adjustable amplitude-scaler connected to receive the digitized version of the demodulation-reference signal and to apply a scaling factor thereto; and (d) a direct current (d.c.) blocker before the adjustable amplitude-scaler and the first Hilbert transformer, the direct-current blocker being constructed to block any direct-current component from the first Hilbert transformer, the direct-current blocker comprising:
  (1) a double-delay element connected to receive an input signal to the direct-current blocker and to produce an output signal; and
  (2) a subtractor connected to:
    (i) receive, at a minus terminal, the output signal of the double-delay element;
    (ii) receive, at a plus terminal, the input signal to the direct-current blocker; and
    (iii) produce, at an output terminal, a difference which is the output of the direct-current blocker.

33. The apparatus as set forth in claim 1, wherein the compensating delay for the first signal matches a transport delay of the second signal.

34. The apparatus as set forth in claim 1, wherein an output of the compensating delay directly drives a pair of signal inputs to the pair of multipliers that perform the complex demodulation.

35. The apparatus as set forth in claim 2, wherein the output of the compensating delay directly drives a pair of signal inputs to the pair of multipliers that perform the complex demodulation.

36. The apparatus as set forth in claim 1, wherein:
each of the first Hilbert transformer and the second Hilbert transformer comprises (a) a first delay element and a second delay element in tandem, and (b) a subtractor connected to subtract an input to the first delay element from an output the second delay element; and
wherein a multiplier at the output of each of the first Hilbert transformer and the second Hilbert transformer is connected to multiply the gain factor with an output of the subtractor of the respective Hilbert transformer.

37. The apparatus as set forth in claim 36, wherein the gain factor comprises a dynamically-generated multiplier, which is the same at any given time for each of the first Hilbert transformer and the second Hilbert transformer.

38. The apparatus as set forth in claim 1, wherein:
the second Hilbert transformer comprises (a) a first delay element and a second delay element in tandem, and (b) a subtractor connected to subtract from an input to the first delay element an output of the second delay element; and
the gain-controlling circuit is driven by the output of the second delay element and a version of an output of the subtractor of the second Hilbert transformer.

39. The apparatus as set forth in claim 38, wherein:
the gain-controlling circuit comprises a fourth Hilbert transformer, two adders and a correlator;
the correlator comprises a multiplier and an accumulator;
the accumulator comprises a two-input adder, a saturation element, and a delay element; and the saturation element of the accumulator is symmetrically hard limited between a positive value and a negative value.

40. An apparatus for complex demodulating a modulated information signal with a demodulation-reference signal, the apparatus comprising:
(a) a first analog-to-digital converter connected to receive the demodulation-reference signal and to output a digitized demodulation-reference signal;

(b) a phase adjuster operatively coupled to the first analog-to-digital converter, the phase adjuster comprising a first Hilbert transformer and being adapted to introduce a phase angle shift into a digitized version of the demodulation-reference signal; and (c) a second Hilbert transformer having an input that is operatively coupled to the phase adjuster, the second Hilbert transformer being constructed to generate an in-phase output signal and a quadrature output signal;

(d) a gain-controlling circuit adapted to generate a gain factor to be applied to an output of at least one Hilbert transformer of the apparatus, the gain-controlling circuit comprising:
  (1) an gain-error generator adapted to generate a gain error, the gain error being indicative of whether a current value of the gain factor is correct;
  (2) an error-gradient generator adapted to generate an error-gradient, the error-gradient being indicative of a gradient of the gain error with respect to the gain factor;
  (3) a correlator adapted to compute a correlation between the gain error and the error-gradient with respect to the gain error, and further being adapted to output a correlator output; and
  (4) circuitry constructed to apply the correlator output to the output of the at least one Hilbert transformer of the apparatus;

(e) a second analog-to-digital converter adapted to receive the modulated information signal and to output a digitized modulated information signal; and (f) a demodulator operatively coupled to the second analog-to-digital converter, the demodulator comprising:
  (1) a compensating delay element adapted to receive the digitized version of the modulated information signal and to introduce a compensating delay into the digitized version of the modulated information signal; and
  (2) a pair of multipliers operatively coupled to the compensating delay, the pair of multipliers being adapted to perform the complex demodulation of the digitized version of the modulated information signal.

41. The apparatus as set forth in claim 40, wherein:
the modulated information signal comprises a first double-sideband suppressed carrier (DSSC) signal; and
the demodulation-reference signal comprises a single-frequency demodulation-reference signal.

42. The apparatus as set forth in claim 40, wherein:
(a) the gain-controlling circuit further comprises a third Hilbert transformer, the third Hilbert transformer comprising at least a portion of the gain-error generator and the error-gradient generator;

(b) the apparatus further comprising a direct-current blocker connected to receive a version of the digitized demodulation-reference signal, the direct-current blocker comprising a fourth Hilbert transformer and being constructed to block any direct-current component from the first Hilbert transformer;

(c) the apparatus further comprising an adjustable amplitude-scaler connected to receive the digitized version of the demodulation-reference signal and to apply a scaling factor thereto; and (d) the at least one Hilbert transformer of the apparatus comprises the first Hilbert transformer, the second Hilbert transformer, the third Hilbert transformer and the fourth Hilbert transformer.

43. An apparatus for complex demodulating a first double-sideband suppressed carrier (DSSC) signal with a second single-frequency demodulation-reference signal, the apparatus comprising:

(a) an analog-to-digital converter for each of the two signals;

(b) a demodulator comprising a compensating delay for the first signal and a pair of multipliers to perform complex demodulation of the first signal;

(c) an adjustable amplitude-scaler connected to input a digitized version of the demodulation reference signal from one of the analog-to-digital converters;

(d) a first Hilbert transformer as a direct-current blocker connected to the adjustable amplitude scaler;

(e) a phase adjuster comprising a second Hilbert transformer and a combiner, wherein the combiner comprises two multipliers and a subtractor;

(f) a third Hilbert transformer connected to the phase adjuster, the third Hilbert transformer being constructed to provide demodulating signals in quadrature to the pair of multipliers of the demodulator; and (g) a gain-controlling circuit having an input and an output for outputting a gain factor in response to a gain error, the gain-controlling circuit comprising (1) an error-gradient generator operatively coupled to the input of the gain-controlling section and constructed to generate an error-gradient, which is indicative of a gradient of the gain error with respect to the gain factor;

(2) an error-signal generator operatively coupled to the error-gradient generator, the error-signal generator being constructed to produce the gain error and to output the gain error to the error-gradient generator, the gain error being indicative of whether a present value of the gain factor is correct;

(3) a correlator constructed to compute a correlation between the gain error and the error-gradient with respect to the gain error, the correlator further being constructed to output the computed correlation as a gain factor;

(4) circuitry to scale and bias the correlator output to obtain the optimum gain; and (5) a circuit constructed to adjust a gain of at least one component of the apparatus, the circuit adjusting the gain by multiplying a version of the correlator output, which corresponds to the gain factor output by the correlator, with the output of the at least one component of the apparatus.

* * * * *